(12) United States Patent
Shoham et al.

(10) Patent No.: US 9,470,751 B2
(45) Date of Patent: Oct. 18, 2016

(54) DETECTING OPEN AND SHORT OF CONDUCTORS

(71) Applicant: APPLIED MATERIALS ISRAEL, LTD., Rehovot (IL)

(72) Inventors: Amir Shoham, Nes Ziona (IL); Alon Litman, Ness Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 119 days.

(21) Appl. No.: 14/153,982

(22) Filed: Jan. 13, 2014

(65) Prior Publication Data

US 2015/0198648 A1    Jul. 16, 2015

(51) Int. Cl.
*G01R 31/305* (2006.01)
*G01R 31/26* (2014.01)
*G01R 31/28* (2006.01)

(52) U.S. Cl.
CPC ......... *G01R 31/305* (2013.01); *G01R 31/2812* (2013.01); *G01R 31/2853* (2013.01)

(58) Field of Classification Search
CPC ............ G01R 31/305; G01R 31/2812; G01R 31/2853

USPC ......................... 324/501, 754.22; 438/14, 16
See application file for complete search history.

(56) References Cited

U.S. PATENT DOCUMENTS

| | | | |
|---|---|---|---|
| 6,913,939 B2* | 7/2005 | Kang | G01R 31/307 324/754.22 |
| 2007/0057200 A1* | 3/2007 | Fujita | B82Y 10/00 250/492.1 |
| 2009/0152595 A1* | 6/2009 | Kaga | G01R 31/2884 257/208 |

* cited by examiner

*Primary Examiner* — Farhana Hoque
(74) *Attorney, Agent, or Firm* — Kilpatrick Townsend & Stockton LLP

(57) ABSTRACT

A system and a method for evaluating a conductor, the method may include: illuminating a first area of a conductor by a first electron beam thereby charging the first area; illuminating by a second electron beam a second area of the conductor; and wherein an aggregate size of the first and second areas is a fraction of an overall size of the conductor; detecting, by a detector, detected emitted electrons that were emitted substantially from the second area and generating detection signals indicative of the detected emitted electrons; and processing, by a processor, the detection signals to provide information about a conductivity of the conductor.

18 Claims, 7 Drawing Sheets

DETECTING OPEN AND SHORT OF CONDUCTORS

BACKGROUND OF THE INVENTION

Conductors are one of the basic elements of electrical circuits. They are expected to convey electrical signals from one end to another. Modern manufacturing processes are expected to manufacture fault free conductors that may be relatively long but have a small cross section. Conductors can exhibit discontinuities that may be extremely small and thus are very hard to detect and require very long inspection sequences to be detected.

There is a growing need to evaluate the conductivity of a conductor in a fast and reliable manner.

BRIEF SUMMARY OF THE INVENTION

A method and a system for detecting open and shorts of conductors.

There may be provided, according to an embodiment of the invention, a method for evaluating a conductor during a fabrication of an electrical circuit, the method may include illuminating by a first electron beam a first area of a conductor thereby charging the first area; illuminating by a second electron beam a second area of the conductor; wherein an aggregate size of the first and second areas may be a fraction of an overall size of the conductor; detecting, by a detector, detected emitted electrons that were emitted substantially from the second area and generating detection signals indicative of the detected emitted electrons; and processing, by a processor, the detection signals to provide information about a conductivity of the conductor.

The second area may be spaced apart from the first area.

The distance between the first and second areas may be bigger than a distance between the first area and a first end of the conductor and a distance between the second area and a second end of the conductor.

The processing may include determining that the first area may be not electrically coupled to the second area if the detection signals may be indicative that the second area may be not charged as a result of the charging of the first area.

The processing may include determining that the first area may be electrically coupled to the second area if the detection signals may be indicative that the second area may be charged as a result of the charging of the first area.

Most of the conductor may be buried under an isolating layer.

The conductor may be coupled to a three dimensional NAND flash memory array.

The first electron beam may have an intensity that exceeds an intensity of the second electron beam.

The first electron beam may have an intensity that exceeds an intensity of the second electron beam by at least a factor of fifty.

The processing may include determining that the conductor may be defective if the detection signals may be indicative that a charging rate of the second area deviates from an expected charging rate of the conductor.

The second area and the first area may at least partially overlap.

The processing may include determining that the conductor may be defective if the detection signals may be indicative that a charging rate of the second area deviates from an expected charging rate of the conductor.

The processing may include determining a location of a discontinuity in the conductor based upon an amount of deviation of the charging rate of the second area from the expected charging rate of the conductor.

There may be provided, according to an embodiment of the invention, a method for evaluating an array of conductors that may include multiple groups of conductors, the method may include charging first areas of a first group of conductors with a first electron beam; repeating, for each group of the conductors of the array except the first group of conductors and a last group of conductors; imaging, by using a second electron beam, first areas of a group of conductors that was charged but not imaged while charging, by the first electron beam, first areas of a group of conductors that were not illuminated by the first electron beam; imaging, by using the second electron beam, first areas of the last group of conductors; and processing, by a processor, detection signals obtained during the imaging of the groups of conductors of the array to provide information about a conductivity between conductors of the array.

The conductors of different groups of conductors of the array may be expected to be isolated from each other.

Each group of conductors may form a line of conductors.

The different groups of conductors may have a same shape.

A major part of each conductor of the array may be buried under an isolating layer.

Each conductor of the array may be coupled to a three dimensional NAND flash memory array.

There may be provided, according to an embodiment of the invention, a method for evaluating a conductivity of a conductor, the method may include illuminating a first area of the conductor by a first electron beam thereby charging the first area and generating first detection signals indicative of electrons that were emitted substantially from the first area due to the illuminating of the first area; illuminating a second area of the conductor by a second electron beam thereby charging the second area and generating second detection signals indicative of electrons that were emitted substantially from the second area due to the illuminating of the second area; wherein the first area and the second area may be spaced apart from each other; wherein the first and second electron beams differ from each other by at least one electrical parameter; and processing the first and second detection signals to provide information about a conductivity of the conductor.

The electrical parameter may be an intensity.

The electrical parameter may be a landing energy.

The processing may include determining that the conductor may have a discontinuity if the detection signals may be indicative that a charging rate of the second area deviates by at least a predetermined amount from a charging rate of the first area.

The processing may include determining a location of the discontinuity in response to a difference between the charging rates of the first and second areas.

The processing may include determining that the conductor may be of an acceptable state if the charging rates of the first and second areas may be substantially equal to each other.

There may be provided, according to an embodiment of the invention, a system for evaluating a conductor, the system may include electron optics for illuminating a first area of a conductor by a first electron beam thereby charging the first area and for illuminating by a second electron beam a second area of the conductor; and wherein an aggregate size of the first and second areas may be a fraction of an overall size of the conductor; a detector for detecting emitted electrons that were emitted substantially from the second area and generating detection signals indicative of the detected emitted electrons; and a processor for processing the detection signals to provide information about a conductivity of the conductor.

The second area may be spaced apart from the first area.

The distance between the first and second areas may be bigger than a distance between the first area and a first end of the conductor and a distance between the second area and a second end of the conductor.

The processor may be arranged to determine that the first area may be not electrically coupled to the second area if the detection signals may be indicative that the second area may be not charged as a result of the charging of the first area.

The processor may be arranged to determine that the first area may be electrically coupled to the second area if the detection signals may be indicative that the second area may be charged as a result of the charging of the first area.

Most of the conductor may be buried under an isolating layer.

The conductor may be coupled to a three dimensional NAND flash memory array.

The first electron beam may have an intensity that exceeds an intensity of the second electron beam.

The first electron beam may have an intensity that exceeds an intensity of the second electron beam by at least a factor of fifty.

The processor may be arranged to determine that the conductor may be defective if the detection signals may be indicative that a charging rate of the second area deviate from an expected charging rate of the conductor.

The second area and the first area at least partially overlap.

The processor may be arranged to determine that the conductor may be defective if the detection signals may be indicative that a charging rate of the second area deviates from an expected charging rate of the conductor.

The processor may be arranged to determine a location of a discontinuity if the conductor if the detection signals based upon an amount of deviation of the charging rate of the second area from the expected charging rate of the conductor.

There may be provided, according to an embodiment of the invention, a system for evaluating an array of conductors that may include multiple groups of conductors, the system may include electron optics that may be arranged to charge first areas of a first group of conductors with a first electron beam; repeat, for each group of the conductors of the array except the first group of conductors and a last group of conductors imaging, by using a second electron beam, second areas of a group of conductors that was charged but not imaged while charging, by the first electron beam, first areas of a group of conductors that were not illuminated by the first electron beam; imaging, by using the second electron beam, second areas of the last group of conductors; and a processor that may be arranged to process detection signals obtained during the imaging of the groups of conductors of the array to provide information about a conductivity of the conductors of the array.

Each group of conductors may form a line of conductors.

The different groups of conductors may have a same shape.

The major part of each conductor of the array may be buried under an isolating layer.

Each conductor of the array may be coupled to a three dimensional NAND flash memory array.

There may be provided, according to an embodiment of the invention, a system for evaluating a conductivity of a conductor, the system may include electron optics that may be arranged to illuminate a first area of the conductor by a first electron beam thereby charging the first area and generating first detection signals indicative of electrons that were emitted substantially from the first area due to the illuminating of the first area; illuminate a second area of the conductor by a second electron beam thereby charging the second area and generating second detection signals indicative of electrons that were emitted substantially from the second area due to the illuminating of the second area; wherein the first area and the second area may be spaced apart from each other; wherein the first and second electron beams differ from each other by at least one electrical parameter; and a processor that may be arranged to process the first and second detection signals to provide information about a conductivity of the conductor.

The electrical parameter may be an intensity.

The electrical parameter may be a landing energy.

The processor may be arranged to determine that the conductor may have a discontinuity if the detection signals may be indicative that a charging rate of the second area deviates by at least a predetermined amount from a charging rate of the first area.

The processor may be arranged to determine a location of the discontinuity in response to a difference between the charging rates of the first and second areas.

The processor may be arranged to determine that the conductor may be of an acceptable state if the charging rates of the first and second areas may be substantially equal to each other.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
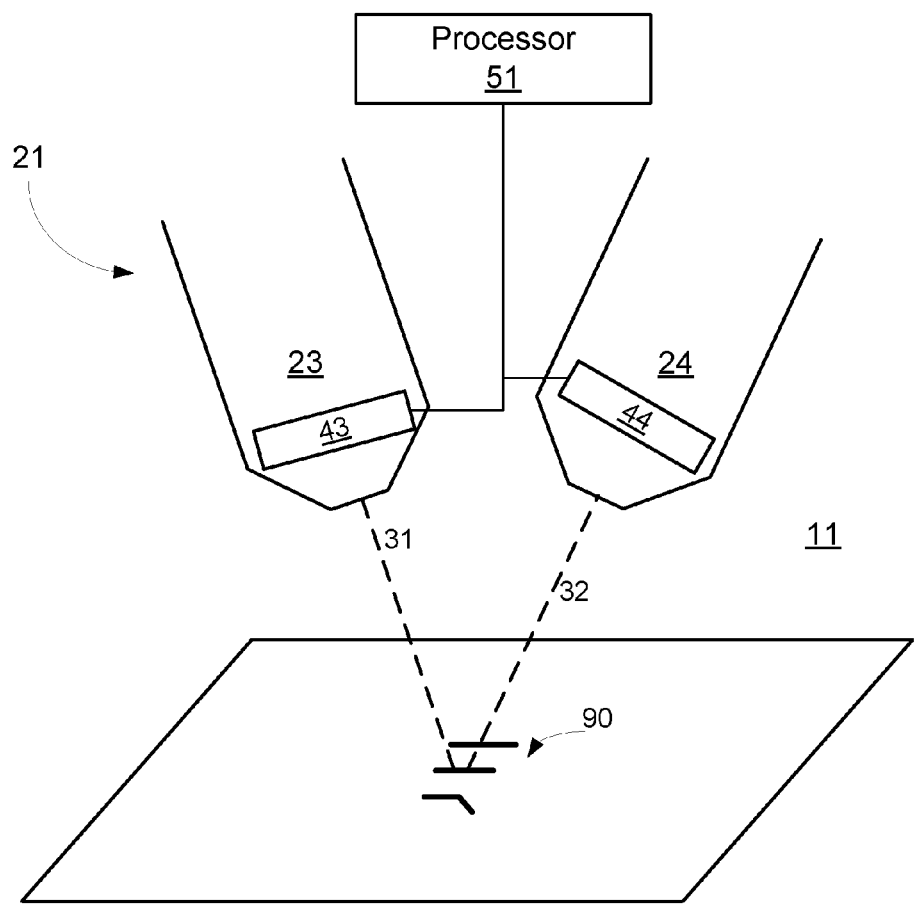
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

According to an embodiment of the invention there is provided a method and system for evaluating a conductivity of a conductor.

Dual Beam Inspection

Figure 2:
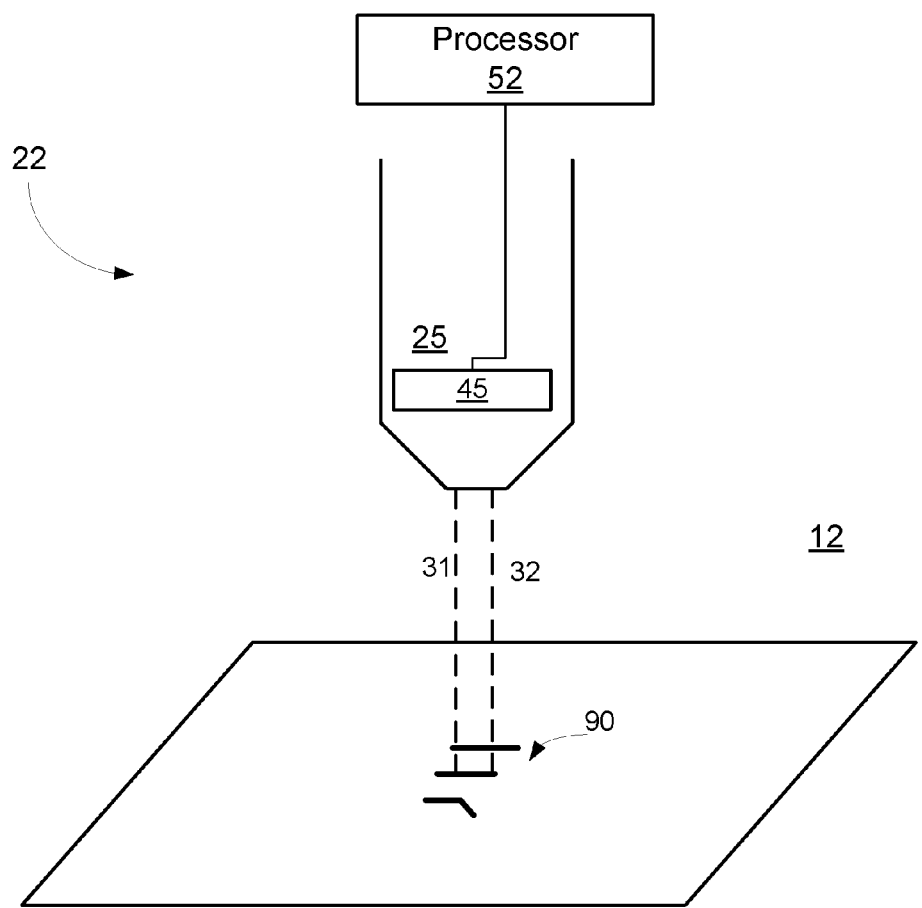
FIG. 2 illustrates a system according to an embodiment of the invention.

FIGS. 1 and 2 illustrate systems 11 and 12 according to various embodiment of the invention.

System 11 includes electron optics 21 and system 12 includes electron optics 22. Each of the electron optics 21 and 22 is arranged to direct a first and a second electron beam 31 and 32 towards one or more conductors of the groups of conductors such as group of conductors 90. Electron optics 21 included two tilted columns 23 and 24 while electron optics 22 includes a single dual-electron beam column 25. The relative tilt between the columns is optional. The columns may be parallel to each other. Alternatively, a single column may generate the first and second electron beams 31 and 32.

System 11 also includes detectors 43 and 44 (that are illustrated as being included in columns 23 and 24) and system 12 includes detector 45 (illustrated as being included in column 25). It is noted that there may be more than one detector per column and that one or more detectors can be positioned outside a column. The detectors can be secondary electron detectors, backscattered electron detectors and the like.

System 11 further includes processor 51 for processing detection signals received from detectors 43 and 44. System 12 includes processor 52 for processing detection signals received from detector 45.

Each system of 11 and 12 may include a mechanical stage. The mechanical stage (not shown) can introduce movement between a column and a sample. Additionally or alternatively electronic deflection can be used to scan one or more conductors of the sample.

According to an embodiment of the invention, the first and the second electron beam 31 and 32 differ from each other by at least one parameter such as intensity and/or landing energy in order to differentiate between charging that is caused by each one of these electron beams. For example, while electrons of the first electron beam 31 can have a first landing energy that will cause a conductor to be charged to a positive potential, the electrons of the second electron beam 32 can have a second landing energy that will cause a conductor to be charged to a negative potential. If the first electron beam 31 scans a first area of a conductor and the second electron beam 32 scans a second area of the conductor and these areas are electrically coupled to each other then each of the first and second area will be affected by both electron beams and will reach an equilibrium. If these areas are disconnected each beam will affect only one part of the conductor and these areas will exhibit different charging conditions. The latter scenario is illustrated in FIG. 3.

Figure 3:
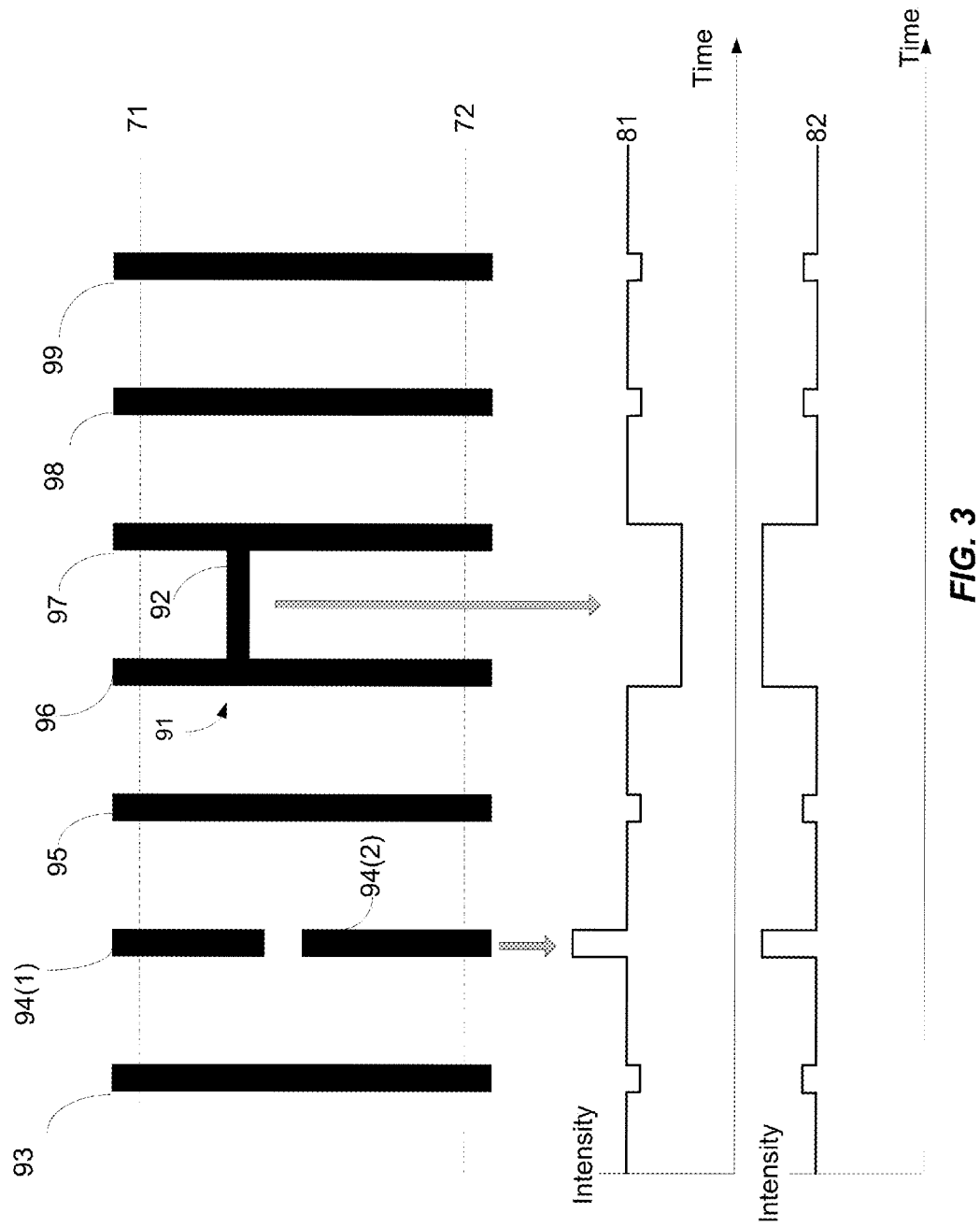
FIG. 3 illustrates a group of conductors that is scanned by two electron beams and detection signals resulting from the scanning of the group of conductors according to an embodiment of the invention.

FIG. 3 illustrates a group of conductors 90 that is scanned by two electron beams 31 and 32 (the scanning occurs along scan lines 71 and 72 respectively) and detection signals 81 and 82 resulting from the scanning of the group of conductors according to an embodiment of the invention.

The group of conductors 90 includes conductors 93-99 that are parallel to each other. Conductor 94 is defective—it includes a discontinuity that separates it to two parts 94(1) and 94(2).

Conductors 96 and 87 are connected to each other by short 92—they are also defective.

The first electron beam 31 follows a first scan line 71 that is perpendicular to the conductors 93-99 and passed near their top ends.

The second electron beam 32 follows a second scan line 72 that is perpendicular to the conductors 93-99 and passed near their bottom ends.

The first and second electron beams 31 and 32 change the entire body of each one of conductors 93 and 95-99 while first electron beam 31 only charges part 94(1) and second electron beam 32 only charges part 94(2).

Due to the difference between the first and second electron beams 31 and 32 (for example—because of landing energy differences)—part 94(1) will seem to be more positively charged than part 94(2)—and detection signals 81 and 82 reflect these differences. These changes are reflected in detection signal 81 and 82.

Due to short 92 (that connected conductors 96 and 97) each one of the first and second electron beams 31 and 32 has to charge a conductive element 91 (combination of short 92 and conductors 96 and 97) that is much larger than a single conductor (out of 93-99) and this conductive element 91 is less affected by the charging than each one of conductors 93-99. This is also reflected in detection signals 81 and 82. Detection signals 81 and 82 also reflect (by relatively small steps) the difference between the charging of conductors 93-99 and their vicinity. The conductors can be regarded as not having a fixed predefined potential—are so-called floating—they are usually not set to a fixed potential (for example—are not grounded or are not constantly fed by a fixed power source) and thus such changes may not exist of have a different form.

Figure 4:
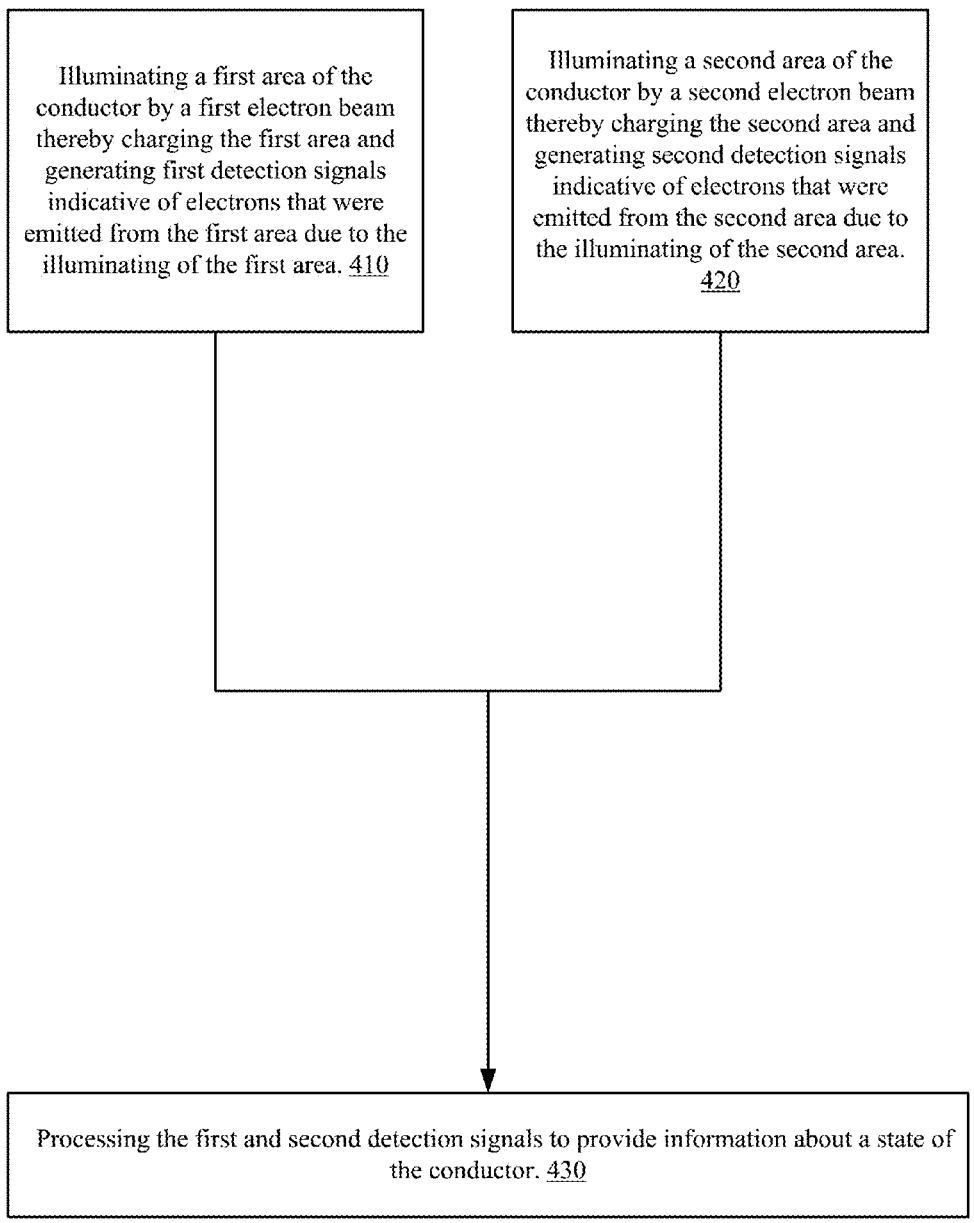
FIG. 4 illustrates a method according to an embodiment of the invention.

FIG. 4 illustrates method 400 according to an embodiment of the invention.

Method 400 starts by stage 410 and 420.

Stage 410 includes illuminating a first area of the conductor by a first electron beam thereby charging the first area and generating first detection signals indicative of electrons that were emitted from the first area due to the illuminating of the first area.

Stage 420 includes illuminating a second area of the conductor by a second electron beam thereby charging the second area and generating second detection signals indicative of electrons that were emitted from the second area due to the illuminating of the second area. The first area and the second area are spaced apart from each other. The first and second electron beams differ from each other by at least one electrical parameter. The electrical parameter may be an intensity and, additionally or alternatively a landing energy. Different values of the landing energy can cause changes in the charging regime—positive or negative and the amount of positive or negative charging.

Stage 410 and 420 may be executed in parallel so that each conductor can be charged by both electron beams.

Stages 410 and 420 may be followed by stage 430 of processing the first and second detection signals to provide information about a state of the conductor.

The state of the conductor can indicate whether the conductor is in an acceptable condition or is defective—may be shortened to another conductor ("also referred to as a "short" state) or may exhibit a discontinuity (also referred to as an "open" state).

The processing may include determining that the conductor has a discontinuity if the detection signals are indicative that a charging rate of the second area deviates by at least a predetermined amount from a charging rate of the first area.

If a discontinuity is formed between the first and second areas the charging of the first area will affect a first portion of the conductor but will not affect a second portion of the conductor and vise verse. The first portion includes the first area while the second portion includes the second area.

The location of the discontinuity defines the sizes of the first and second portions. The size of the first portion affects a charging rate of the first area. The size of the second portion affects the charging rate of the second area. A relationship between the charging rates of first and second portions reflects a size relationship between the first and second portions. This so-called size relationship provides an indication about the location of the discontinuity. For example, if the discontinuity is closer to the first area then to the second area then the first portion will have a lower capacitance and higher charge rate in respect to the second portion.

The processing may include determining that the conductor is of an acceptable state if the charging rates of the first and second areas are substantially equal to each other.

One or More Electron Beam Inspection

Either one of the following methods may be implemented by any of the mentioned above systems as well as systems that have electron optics arranged to generate a single electron beam or more than two electron beams.

Figure 5:
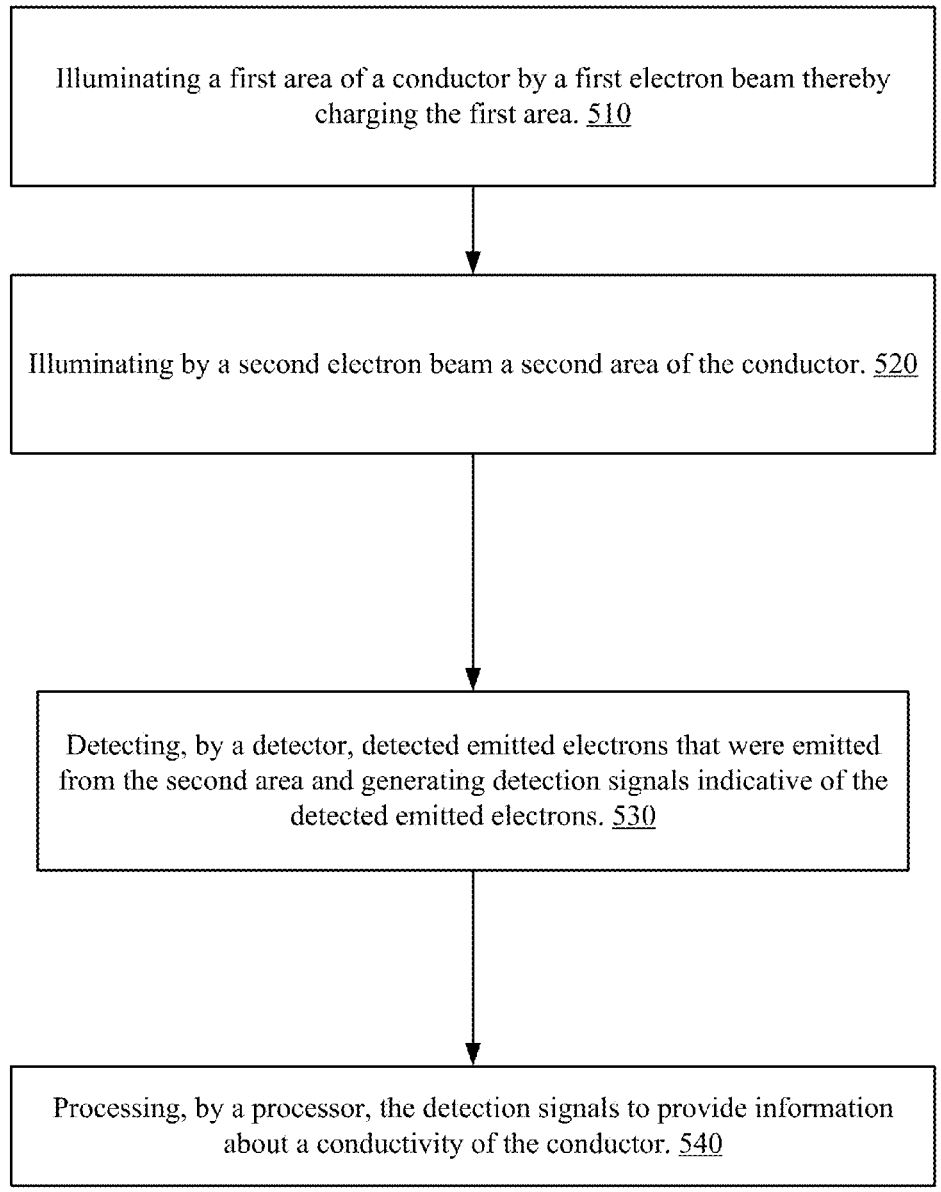
FIG. 5 illustrates a method according to an embodiment of the invention.

FIG. 5 illustrates method 500 for evaluating a conductor, according to an embodiment of the invention.

Method 500 may start by stage 510 of illuminating a first area of a conductor by a first electron beam thereby charging the first area.

Stage 510 may be followed by stage 520 of illuminating by a second electron beam a second area of the conductor.

Method 500 may include illuminating only a small part of the entire conductor (for example—between 1 and 20% of the conductor). Thus—the aggregate size of the first and second areas is a fraction of an overall size of the conductor.

The second area can be spaced apart from the first area. These areas can be positioned at opposite ends of the conductor. The distance between the first and second areas is bigger than a distance between the first area and a first end of the conductor and a distance between the second area and a second end of the conductor.

Stage 520 may be followed by stage 530 of detecting, by a detector, detected emitted electrons that were emitted substantially from the second area and generating detection signals indicative of the detected emitted electrons.

Stage 530 may be followed by stage 540 of processing, by a processor, the detection signals to provide information about a conductivity of the conductor.

Stage 540 may include at least one out of:
  a. Determining that the first area is not electrically coupled to the second area if the detection signals are indicative that the second area is not charged as a result of the charging of the first area.
  b. Determining that the first area is electrically coupled to the second area if the detection signals are indicative that the second area is charged as a result of the charging of the first area.
  c. Determining that the conductor is defective if the detection signals are indicative that a charging rate of the second area deviates from an expected charging rate of the conductor.

Method 500 may be applied when most of the conductor is buried under an isolating layer. In this case first and second areas are not buried under the isolating layer. The conductor may be coupled to a three dimensional NAND flash memory array.

The first electron beam may have an intensity that exceeds (for example by a factor of 10, 20, 30, 40, 50, 60, 70, 80, 90, 100 or even more) an intensity of the second electron beam.

According to another embodiment of the invention the second area and the first area at least partially overlap and stage 540 may include at least one out of:
  a. Determining that the conductor is defective if the detection signals are indicative that a charging rate of the second area deviates from an expected charging rate of the conductor.
  b. Determining a location of a discontinuity of the conductor based upon an amount of deviation of the charging rate of the second area from the expected charging rate of the conductor.

Figure 6:
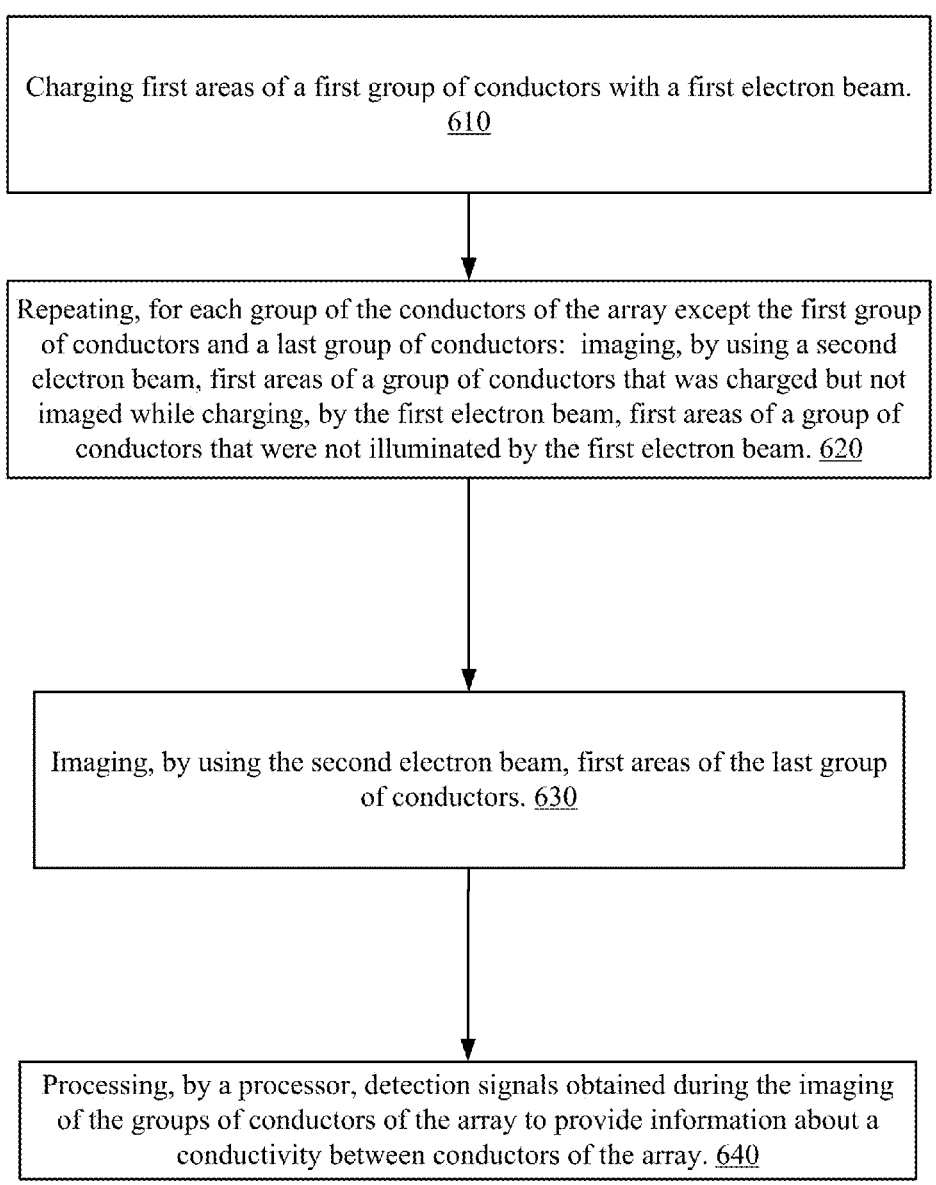
FIG. 6 illustrates a method according to an embodiment of the invention.

FIG. 6 illustrates method 600 according to an embodiment of the invention.

Figure 7:
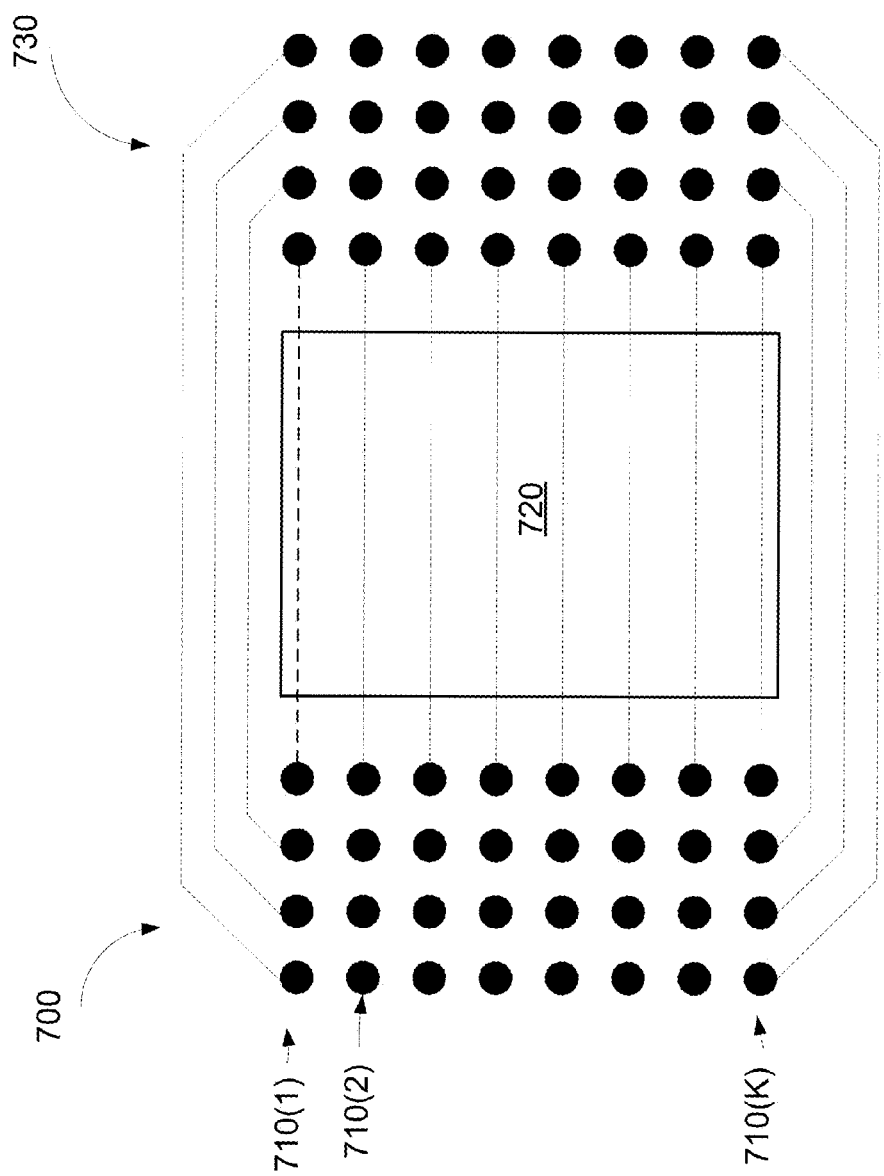
FIG. 7 illustrates an array 700 and multiple groups of conductors of the array according to an embodiment of the invention.

Method 600 includes imaging an array of conductors e.g. as array 700 which is illustrated in FIG. 7. The array includes multiple groups of conductors. The method includes charging one group after the other and finding the effect of charging one group on another group of conductors. Should the conductors of different groups be isolated from each other, charging of one group will not result in the charging of conductors of another group.

Method 600 may start by stage 610 of charging first areas of a first group of conductors with a first electron beam.

Stage 610 may be followed by stage 620 of repeating, for each group of the conductors of the array except the first group of conductors and a last group of conductors: imaging, by using a second electron beam, first areas of a group of conductors that was charged but not imaged while charging, by the first electron beam, first areas of a group of conductors that were not illuminated by the first electron beam.

At the end of stage 620 all groups but the last group are imaged. Stage 620 is followed by stage 630 of imaging, by using the second electron beam, first areas of the last group of conductors.

Stage 630 is followed by stage 640 of processing, by a processor, detection signals obtained during the imaging of the groups of conductors of the array to provide information about a conductivity between conductors of the array.

Each group of conductors can have a unique shape and/or size although different groups can have the same size and/or shape. The array of conductor can be a rectangular array, a regular array and even an irregular array of conductors.

The conductors of the arrays may be mostly buried under an isolating layer and may be connected to a three dimensional NAND flash memory array.

FIG. 7 illustrates an array 700 and multiple groups of conductors of the array according to an embodiment of the invention. Array 700 includes K groups 710(1)-710(K), each includes a line of conductors, each conductor is connected to control or other ports of a three dimensional NAND flash memory array 720 and each conductor is mostly buried under an isolating layer. This is illustrates by some dashed lines that stretch from some of the conductors and below the three dimensional NAND flash memory array 720. As known in the art, some NAND flash memory vendors have at two opposite sides of the three dimensional NAND flash memory array 720 arrays of conductors and FIG. 7 illustrates an additional array 730. Each conductor of array 700 may be connected to a connector of array 700.

In the foregoing specification, the invention has been described with reference to specific examples of embodiments of the invention. It will, however, be evident that various modifications and changes may be made therein without departing from the broader spirit and scope of the invention as set forth in the appended claims.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for evaluating a conductor during a fabrication of an electrical circuit, the method comprising:
   simultaneously illuminating a first area of the conductor with a first electron beam thereby charging the first area, and illuminating a second area of the conductor with a second electron beam, the second area spaced apart from the first area, where an aggregate size of the first and second areas is a fraction of an overall size of the conductor;
   detecting electrons emitted from the first and second areas with one or more detectors and generating detection signals indicative of the detected emitted electrons; and
   processing, by a processor, the detection signals to provide information about a conductivity of the conductor between the first area and the second area,
   wherein the first electron beam and the second electron beam charge the conductor by at least one of different charging rates or opposite polarities such that the charging of the conductor by each of the first electron beam and the second electron beam can be differentiated for determining whether the second area is charged as a result of the charging of the first area.

2. The method according to claim 1 wherein a distance between the first and second areas is bigger than a distance between the first area and a first end of the conductor and a distance between the second area and a second end of the conductor.

3. The method according to claim 1 wherein the processing comprises determining that the first area is not electrically coupled to the second area if the detection signals are indicative that the second area is not charged as a result of the charging of the first area.

4. The method according to claim 1 wherein the processing comprises determining that the first area is electrically coupled to the second area if the detection signals are indicative that the second area is charged as a result of the charging of the first area.

5. The method according to claim 1 wherein most of the conductor is buried under an isolating layer.

6. The method according to claim 1 wherein the conductor is coupled to a three dimensional NAND flash memory array.

7. The method according to claim 1 wherein the first electron beam has an intensity that exceeds an intensity of the second electron beam.

8. The method according to claim 1 wherein the first electron beam has an intensity that exceeds an intensity of the second electron beam by at least a factor of fifty.

9. The method according to claim 1 wherein the processing comprises determining that the conductor is defective if the detection signals are indicative that a charging rate of the second area deviates from an expected charging rate of the conductor.

10. The method according to claim 1 wherein the second area and the first area at least partially overlap.

11. The method according to claim 10 wherein the processing comprises determining that the conductor is defective if the detection signals are indicative that a charging rate of the second area deviates from an expected charging rate of the conductor.

12. The method according to claim 11 wherein the processing comprises determining a location of a discontinuity in the conductor based upon an amount of deviation of the charging rate of the second area from the expected charging rate of the conductor.

13. The method according to claim 1 where an aggregate size of the first and second areas is between 1 and 20 percent of the overall size of the conductor.

14. The method according to claim 1 wherein the first and second electron beams differ in at least one of intensity and/or landing energy.

15. A system for evaluating a conductor, the system comprising:
   electron optics for simultaneously illuminating a first area of the conductor by a first electron beam thereby charging the first area, and illuminating a second area of the conductor by a second electron beam, the second area spaced apart from the first area, where an aggregate size of the first and second areas is a fraction of an overall size of the conductor;
   a detector for detecting emitted electrons emitted from the first and second areas and generating detection signals indicative of the detected emitted electrons; and
   a processor for processing the detection signals to provide information about a conductivity of the conductor between the first area and the second area,
   wherein the first electron beam and the second electron beam charge the conductor by at least one of different charging rates or opposite polarities such that the charging of the conductor by each of the first electron beam and the second electron beam can be differentiated for determining whether the second area is charged as a result of the charging of the first area.

16. The system of claim 15 wherein the first and second electron beams differ in at least one of intensity and/or landing energy.

17. The system of claim 16 wherein the first electron beam has an intensity that exceeds an intensity of the second electron beam.

18. The system of claim 16 wherein the first electron beam has an intensity that exceeds an intensity of the second electron beam by at least a factor of fifty.

* * * * *